United States Patent
Philipp

(10) Patent No.: US 9,018,518 B2
(45) Date of Patent: Apr. 28, 2015

(54) SOLAR MODULE ARRAYS AND DIODE CABLE

(75) Inventor: Jan Boris Philipp, München (DE)

(73) Assignee: Saint-Gobain Glass France, Courbevoie (FR)

( * ) Notice: Subject to any disclaimer, the term of this patent is extended or adjusted under 35 U.S.C. 154(b) by 128 days.

(21) Appl. No.: 13/519,576

(22) PCT Filed: Jan. 27, 2011

(86) PCT No.: PCT/EP2011/051129
§ 371 (c)(1),
(2), (4) Date: Jun. 27, 2012

(87) PCT Pub. No.: WO2011/092237
PCT Pub. Date: Aug. 4, 2011

(65) Prior Publication Data
US 2012/0285502 A1 Nov. 15, 2012

(30) Foreign Application Priority Data
Jan. 29, 2010 (EP) .................................... 10152088

(51) Int. Cl.
*H01L 31/05* (2014.01)
*H01R 11/00* (2006.01)
*H02S 40/34* (2014.01)

(52) U.S. Cl.
CPC ................. *H01L 31/05* (2013.01); *Y02E 10/50* (2013.01); *H02S 40/34* (2013.01)

(58) Field of Classification Search
CPC .............................. H01L 35/05; H01R 11/00
USPC ................. 136/244, 251, 252, 256; 174/74 R
See application file for complete search history.

(56) References Cited

U.S. PATENT DOCUMENTS

| | | | |
|---|---|---|---|
| 2005/0133086 A1* | 6/2005 | Itoyama et al. | 136/256 |
| 2008/0112097 A1* | 5/2008 | Maharsi et al. | 361/13 |

FOREIGN PATENT DOCUMENTS

| | | |
|---|---|---|
| DE | 4324318 C1 | 1/1995 |
| EP | 1 585 178 A1 | 10/2005 |
| JP | 7 131045 A | 5/1995 |
| JP | 2009 295615 A | 12/2009 |
| WO | 2009/137347 A2 | 11/2009 |

OTHER PUBLICATIONS

JPH07131045, 1995, Kubota machine translation.*
PCT Search Report for International Application PCT/EP2011/051129 filed on Jan. 27, 2011 in the name of Saint-Gobain Glass France et al. Mail Date: May 16, 2012.
PCT Written Opinion mailed May 16, 2012 issued for International Application PCT/EP2011/051129 filed on Jan. 27, 2011 in the name of Saint-Gobain Glass France et al. (English + German).

* cited by examiner

*Primary Examiner* — Susan D Leong
(74) *Attorney, Agent, or Firm* — Steinfl & Bruno, LLP

(57) ABSTRACT

Solar module arrays are described, including a solar module for photovoltaic energy generation, a connection housing connected to the solar module for connecting the solar module to an electric load, and a free-wheeling diode connected antiparallel to the solar module. A diode cable is also described.

7 Claims, 2 Drawing Sheets

SOLAR MODULE ARRAYS AND DIODE CABLE

CROSS REFERENCE TO RELATED APPLICATIONS

The present application is the US national stage of International Application PCT/EP2011/051129 filed on Jan. 27, 2011, which, in turn, claims priority to European Patent Application 10152088.0 filed on Jan. 29, 2010.

The invention relates generically to solar module arrays according to the main clause of the coordinated claims. It further extends to a diode cable for use in such solar module arrays.

Solar modules for the photovoltaic conversion of sunlight into electric power are increasingly used for energy generation. In terms of efficiency, thin-film solar modules based on polycrystalline chalcopyrite semiconductors have proven advantageous with, in particular, copper-indium diselenide ($CuInSe_2$ or CIS) distinguished by a particularly high absorption coefficient because of its band gap suited to the spectrum of sunlight. Since with individual solar cells only voltage levels of less than 1 V can be reached, as a rule, a plurality of solar cells are serially connected in a solar module in order to thus obtain a technically useful output voltage. For this, thin-film solar modules offer the particular advantage that the solar cells can already be connected serially in an integrated form during production of the films. Thin-film solar modules have already been described several times in the patent literature. Reference is made merely by way of example to patent DE 4324318 C1.

For a connection to an electric load, solar modules have at least one connection box that is typically mounted on the back side of the solar module. The connection box contains connection contacts. The electrical connection between the connection contacts and the solar cell circuit is guided, for example, in the form of metal strips from the solar cell circuit out of the module into the connection box. In practical application, a plurality of solar modules are often connected in series by connection cables connected to the connection boxes to form a module string. Here, it is known to provide, for each module, a freewheeling diode or bypass diode that is connected to the connection contacts of the solar module such that in the normal operating state in which the module delivers current, it is reverse biased. By means of the freewheeling diodes connected antiparallel, damage to the solar modules can be prevented; or by means of bypassing, the temporally limited failure of the module string for current generation can be prevented, if, for example, it delivers no current because of shadowing or a module defect, since the current delivered by the other solar modules can flow via the freewheeling diode.

In contrast, the object of the present invention consists in advantageously improving conventional solar modules with, in particular, simplification of production and reduction of production costs. This and further objects are accomplished according to the proposal of the invention by means of solar module arrays with the characteristics of the coordinated claims. Advantageous embodiments of the invention are indicated by means of the characteristics of the subclaims.

According to one aspect of the invention, a solar module array that comprises a solar module for photovoltaic energy generation is presented. Typically, the solar module is provided with a plurality of solar cells connected in series. The solar module can be a crystalline, multi-crystalline silicon solar module or a thin-film solar module with integrated serially connected solar cells. In particular, the semiconductor film can be made from a chalcopyrite compound, which can, for example, be a I-III-VI-semiconductor from the group copper-indium/gallium-disulfide/diselenide $(Cu(InGa)(SSE)_2)$, for example, copper-indium-diselenide ($CuInSe_2$ or CIS) or related compounds, cadmium telluride and/or thin-film silicon.

The solar module array further comprises a (single) connection housing connected to the solar module for connecting the solar module to an electric load, in particular for the serial connection of the solar module with additional solar modules. Here, the connection housing is connected to connection contacts of the solar module that are electrically connected to each other through the solar cells connected in series.

In the solar module array according to the invention, a freewheeling or bypass diode connected antiparallel to the solar module is further provided, by means of which protection of the solar module is achieved in the event of lack of power generation, for example, as a result of shadowing. The two connection contacts of the solar module are electrically connected to each other for this purpose via the freewheeling diode connected in reverse bias.

Essential here is that the freewheeling diode is contained in a diode cable connected to the connection housing and the solar module. Here and in the following, the term "diode cable" means a flexible cable containing a diode but also a rigid module that contains a diode and that can be plugged into the connection box. Without special prior knowledge, the diode cables can be permanently connected according to function to the connection housing and protected from environmental influences.

Here, a flexible cable is a preferably single-core composite of wires jacketed by an electric insulator sheath that has a cross-sectional profile that is uniform or repeatedly uniform at regular intervals.

By means of these measures, it can advantageously be accomplished that the diode can be incorporated, optionally and depending on need, in the solar module array, and not used, in particular, in applications in which shadowing of the solar module is not to be anticipated. This enables simple and cost-effective production of the solar module array. Moreover, the solar module array can advantageously be retrofitted with the freewheeling diode, i.e., after production and, in particular, when it has already been put in position in the respective application. A further advantage of the invention results from the fact that solar modules must be certified in accordance with DIN EN 61646, such that the freewheeling diode or the diode cable can be separately certifiable, as a result of which costs can be saved to a significant extent in industrial series manufacture. Other advantages of the invention emerge from the description of the concrete exemplary embodiments.

In an advantageous embodiment of the solar module array according to the invention, the diode cable is electrically connected to the connection housing via a coupling that comprises a coupling element detachably connected to a complementary coupling element, by means of which particularly simple equipping, in particular, retrofitting, of the solar module array with the freewheeling diode is made possible. Here, the freewheeling diode can even be included in the coupling.

According to another aspect of the invention, a solar module array is presented that comprises a solar module for photovoltaic energy generation as described above. It further includes a first connection housing connected to the solar module and a second connection housing connected to the solar module for connecting the solar module to an electric load. It further includes a freewheeling diode connected antiparallel to the solar module.

Essential here is that the freewheeling diode is contained in a diode cable electrically connecting the two connection housings to each other. Thus, by means of the diode cable, it is possible, even in the case of two connection housings, to accomplish, optionally and depending on need, simple equipping or retrofitting of the solar module array with the freewheeling diode.

The diode cable according to the invention is preferably used for connecting solar modules of a solar module array in a surface area or roof area on which the solar radiation is at times or permanently shadowed. Shadowed regions are located, in particular, in the area around structural installations such as chimneys, antennas, roof superstructures, and other buildings or in the area of trees. The solar module array according to the invention can be adapted to altered shadow conditions by means of diode cables. The diode cable according to the invention can be retrofitted as an optional structural element in a simple manner.

An alternative embodiment of the solar module array according to the invention preferably includes at least two solar modules, with the connection housings of at least one of the solar modules connected by a diode cable.

In an advantageous embodiment of the solar module array, the diode cable is electrically connected to the two connection housings in each case via a coupling that comprises a coupling element detachably connected to a complementary coupling element by means of which the diode cable can be particularly simply connected to the connection housings. Here, the freewheeling diode can even be contained in one of the two couplings.

In another advantageous embodiment of the solar module array, the two connection housings are in each case provided with a connection cable for connecting the solar module to an electric load, wherein the diode cable is electrically conductively connected to the two connection cables. From a technical standpoint, this embodiment can be implemented particularly simply, with the diode cable electrically connected to the two connection cables for simple installation via couplings that in each case comprise a coupling element detachably connected to a complementary coupling element. Here, the freewheeling diode can even be contained in one of the two couplings.

Advantageously, the diode cable is provided on both its ends respectively with a coupling element and a complementary coupling element such that, on the one hand, a connection of the two connection cables with intermediate connection of the freewheeling diode and, on the other, a connection of the connection cable to an electric load can be obtained in a simple manner, without having to undertake structural changes in the connection cables. Here, it is advantageous for the coupling elements and complementary coupling elements of the diode cable to be provided in each case with reverse polarity protection to prevent parallel connection of the freewheeling diode to the solar module. By means of this measure, it is possible to prevent erroneous connection of the freewheeling diode. Such reverse polarity protection can be embodied, for example, by special coloring and/or shaping of the coupling elements and/or complementary coupling elements of the diode cable.

According to another aspect of the invention, a diode cable for use with a solar module array for antiparallel connection of the diode is presented that is provided on both its ends respectively with a coupling element and a complementary coupling element. Advantageously, the coupling elements and/or complementary coupling elements are provided in each case with reverse polarity protection to prevent parallel connection of the diode to the solar module, which protection can be embodied by a special coloration and/or shaping of the coupling elements.

BRIEF DESCRIPTION OF THE DRAWINGS

The invention is now explained in detail with reference to exemplary embodiments with reference made to the accompanying figures. They depict.

DETAILED DESCRIPTION OF THE DRAWINGS

Figure 1:
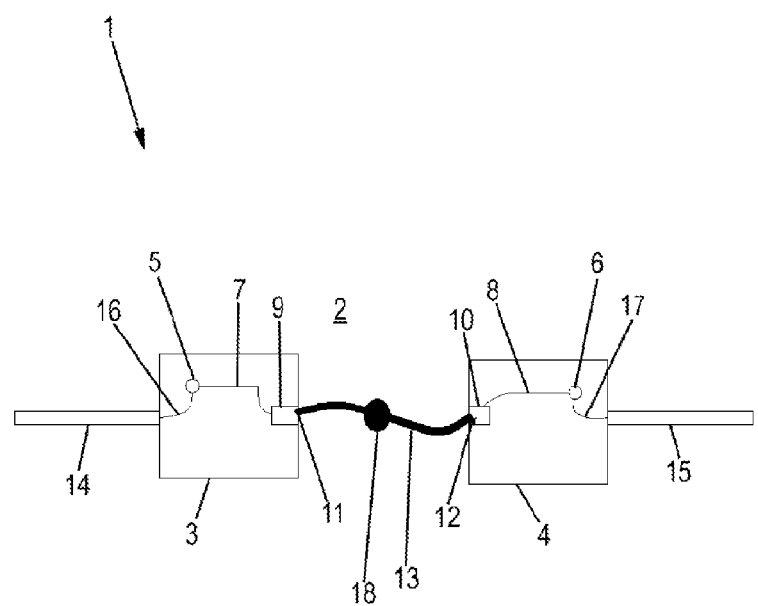
FIG. 1 a schematic representation of a first exemplary embodiment of the solar module array according to the invention.

We refer first to FIG. 1, where a first exemplary embodiment of a solar module identified as a whole with the reference number 1 is illustrated schematically.

The solar module array 1 comprises a solar module 2 used for the photovoltaic conversion of sunlight into electric power, for example, a thin-film solar module, with a plurality of serially connected integrated solar cells. The solar module can, for example, be based on the so-called substrate configuration. In this case, it has a substrate usually made of glass with a layer structure made of thin films that forms a heterojunction (pn-junction) installed thereon. For this purpose, the layer structure can comprise a rear electrode layer arranged on the substrate, a photovoltaically active absorber layer made of a doped semiconductor, a buffer layer, as well as a front electrode layer transparent to radiation in the visible spectral range. For protection against environmental influences, the layer structure is, as a rule, sealed with a cover plate transparent to sunlight. The solar module 2 includes a first connection contact and a second connection contact that can be configured, for example, in the form of metal strips and are electrically connected to each other by means of the serially connected solar cells.

The basic structure of such a solar module 2 is well known per se to the person skilled in the art, for example, from the patent mentioned in the introduction, such that it is not necessary to go into greater detail here. Also, it is not essential to the understanding of the invention, for which reason the solar module 2 is not presented in detail in the figures.

The solar module array 1 further includes two connection boxes 3, 4 for connecting the solar module 2 to an electric load, in particular, for the serial connection of the solar module 2 to other solar modules. Here, a first connection box 3 is electrically conductively connected to the first connection contact of the solar module 2, via an electrical conductor (not shown in detail), for example, a flat conductor that is connected to a first pole terminal 5 of the first connection box 3. The electrical conductor can, for this purpose, be guided, for example, through a hole in the substrate of the solar module. Correspondingly, a second connection box 4 is electrically conductively connected to the second connection contact of the solar module 2, via an electrical conductor (not shown in detail) that is connected to a second pole terminal 6 of the second connection box 4.

Inside the two connection boxes 3, 4, two more electrical conductors are, in each case, connected on the two pole terminals 5, 6, i.e., in the first connection box 3, a first female connection 7, by means of which the first pole terminal 5 is electrically conductively connected to a first connector socket 9, and a first cable connection 16, by means of which the first pole terminal 5 is electrically conductively connected to a first connection cable 14, and also in the second connection box 4 a second female connection 8, by means of which the second pole terminal 6 is electrically conductively connected to a second connector socket 10, and a second cable connection 17, by means of which the second pole terminal 6 is electrically conductively connected to a second connection cable 15. As already mentioned, the two connection cables 14, 15 serve to connect the solar module 2 to an electric load.

The two connection boxes 3, 4 are electrically connected to each other via a diode cable 13, for which purpose the diode cable 13 is provided on both its ends with connector plugs 11, 12 (not shown in detail). The diode cable 13 is thus connected to the two connection boxes 3, 4 by means of the connector plugs 11, 12 plugged into the connector sockets 9, 10 via detachable electric plug connections. The diode cable 13 contains a freewheeling diode 18 that is connected antiparallel to the solar module 2. By means of the freewheeling diode 18, damage to the solar module 2 is prevented, for example, in the event of shadowing or a module defect through erroneous polarity and the shadowed solar module is bypassed. The solar module array 1 can be equipped or retrofitted with the freewheeling diode 18, in a simple manner, by plugging the diode cable 13 into the connection boxes 3, 4. Thus, the freewheeling diode 18 can be used optionally and depending on need, whereby the production costs for the solar module array 1 can be reduced. Moreover, a simple replacement of the freewheeling diode 18 is made possible, for instance, in the event of a functional failure. Last but not least, the freewheeling diode 18 arranged in the diode cable 13 is subject to efficient cooling.

Although this is not depicted in FIG. 1, in a modification of the solar module array 1, the diode cable 13 can be electrically conductively connected directly to the second connection contact of the solar module 2 with a diode in a rigid housing without a second connection box 4. Such a solar module array 1 accordingly includes only a single connection box 3.

Figure 2:
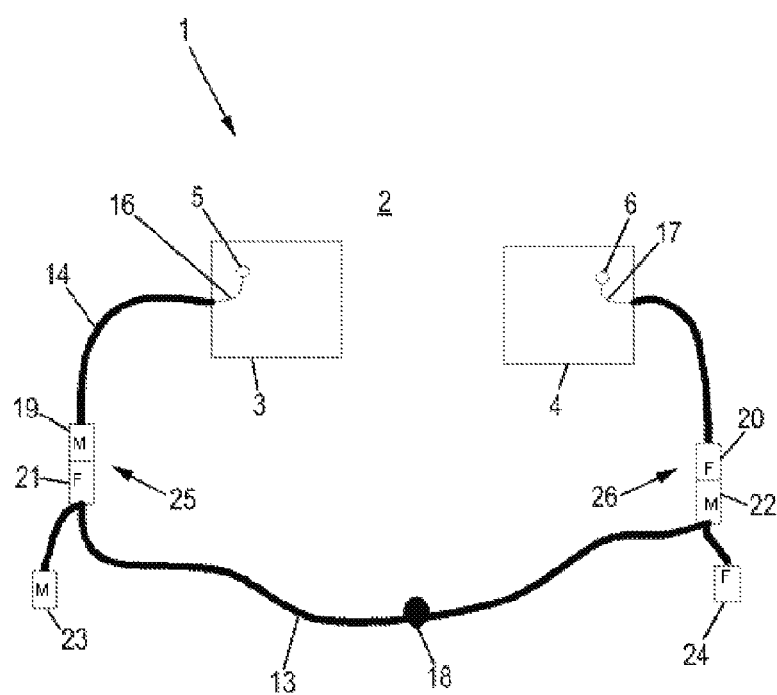
FIG. 2 a schematic representation of the second exemplary embodiment of the solar module array according to the invention.

Reference is now made to FIG. 2, where a second exemplary embodiment of the solar module array 1 is illustrated schematically. To avoid unnecessary repetition, only the differences relative to the first exemplary embodiment depicted in FIG. 1 are explained and, otherwise, reference is made to the statements made there.

Accordingly, the solar module array 1 comprises two connection boxes 3, 4 that have a first pole terminal 5 and a second pole terminal 6, respectively, that are electrically conductively connected to the first connection contact and/or second connection contact of the solar module 2. Only one single electrical line goes from the two pole terminals 3, 4, respectively. These are a first cable connection 16 connected to the first pole terminal 5 that is electrically conductively connected to the first connection cable 14 and a second cable connection 17 connected to the second pole terminal 6 that is electrically conductively connected to the second connection cable 15. The two connection cables 14, 15 are electrically conductively connected to the diode cable 13 containing the freewheeling diode 18 via a first plug connection 25 and a second plug connection 26, respectively. The two plug connections 25, 26 are respectively made up of a plug element and a complementary plug element detachably connected to each other, wherein the plug element here is configured as a male plug (M) and the complementary plug element as a female plug (F). For this purpose, the first connection cable 14 is provided on its free end with a first plug element 19, and the second connection cable 15 is provided on its free end with a first complementary plug element 20. The diode cable 13 forks on both its ends respectively, with a plug element and a complementary plug element arranged on each of the two ends. Thus, one end of the diode cable 13 is provided with a second complementary plug element 21 that forms, together with the first plug element 19, the first plug connection 25; and the other end of the diode cable 13 is provided with a second plug element 22 that forms, together with the first complementary plug element 20, the second plug connection 26. Parallel to the second complementary plug element 21, a third plug element 23 is connected to the diode cable 13. Parallel to the second plug element 22, a third complementary plug element 24 is connected to the diode cable 13. The third plug element 23 and the third complementary plug element 24 can serve for the serial connection of the solar module 2 to other solar modules. By means of the diode cable 13, the solar module array 1 can, in a particularly simple manner, be equipped or retrofitted with the diode 18, without providing a special configuration for the two connection cables 14, 15.

The plug elements 22, 23 and/or complementary plug elements 21, 24 of the diode cable 13 can be provided with reverse polarity protection to prevent the freewheeling wheeling diode 18 from erroneously being connected to the solar module 2 in the forward direction. The plug elements and/or complementary plug elements may, for this purpose, be provided, for example, with color coding or identified by their special shape. However, any other suitable identification of the plug elements and/or complementary plug elements is also conceivable.

The invention makes available a solar module array in which a freewheeling diode connected antiparallel to the solar module is arranged outside the connection boxes such that the freewheeling diode can be used as needed. This enables cost saving and simple equipping or retrofitting of the solar module array with the freewheeling diode. In addition, the freewheeling diode and/or the diode cable can be certified independently of the solar module.

Another aspect of the invention relates to a solar module array (1) that comprises: a solar module (2) for photovoltaic energy generation, a connection housing (3) connected to the solar module (2) for connecting the solar module (2) to an electric load, a freewheeling diode (18) connected antiparallel to the solar module (2), characterized in that the freewheeling diode (18) is contained in a diode cable (13) connected to the connection housing (3) and the solar module (2).

In an advantageous embodiment of the solar module array (1), the diode cable (13) is electrically connected to the connection housing (3) via a coupling (9, 11), that comprises a coupling element (11) detachably connected to a complementary coupling element (9).

In a further advantageous embodiment of the solar module array (1) the freewheeling diode (18) is contained in the coupling (9, 11).

LIST OF REFERENCE CHARACTERS 1 solar module array
2 solar module
3 first connection box
4 second connection box
5 first pole terminal
6 second pole terminal
7 first female connection
8 second female connection
9 first connector socket
10 second connector socket
11 first connector plug
12 second connector plug
13 diode cable 14 first connection cable
15 second connection cable
16 first cable connection
17 second cable connection
18 freewheeling diode
19 first plug element
20 first complementary plug element
21 second complementary plug element
22 second plug element
23 third plug element
24 third complementary plug element
25 first plug connection
26 second plug connection

The invention claimed is:

1. A solar module array, comprising:
   a solar module for photovoltaic energy generation,
   a first connection housing connected to the solar module for connecting the solar module to an electric load,
   a second connection housing connected to the solar module for connecting the solar module to an electric load,
   a freewheeling diode connected antiparallel to the solar module,
      wherein the freewheeling diode is contained in a diode cable electrically connecting the two connection housings to each other,
      wherein the two connection housings are respectively provided with a connection cable for connecting the solar module to an electric load,
      wherein the diode cable is electrically conductively connected to the two connection cables via respective couplings, one coupling comprising a first coupling element detachably connected to a second complementary coupling element, the other coupling comprising a first complementary coupling element detachably connected to a second coupling element, and
      wherein the diode cable is provided with a third coupling element on one end of the diode cable and with a third complementary coupling element on the other end of the diode cable.

2. The solar module array according to claim 1, wherein the diode cable includes a flexible cable.

3. The solar module array according to claim 1, wherein the freewheeling diode is contained in one of the two couplings.

4. The solar module array according to claim 1, wherein the coupling elements and complementary coupling elements of the diode cable are each provided with reverse polarity protection to prevent parallel connection of the freewheeling diode to the solar module.

5. A diode cable containing a diode, for antiparallel connection of the diode as a freewheeling diode to a solar module of a solar array, the diode cable having two cable ends, each cable end being provided with a coupling element and a complementary coupling element not couplingly connected to the coupling element,
   wherein each coupling element and each complementary coupling element comprises an uncoupled portion configured to be connected to separate solar modules.

6. The diode cable according to claim 5, wherein the coupling elements and complementary coupling elements are respectively provided with reverse polarity protection to prevent parallel connection of the diode to connected solar modules.

7. The diode cable according to claim 6, wherein the reverse polarity protection is embodied by coloring and/or shaping of the coupling elements and/or complementary coupling elements.

* * * * *